United States Patent
Kuang et al.

(10) Patent No.: US 12,334,276 B2
(45) Date of Patent: Jun. 17, 2025

(54) METHOD FOR FORMING OF PEROVSKITE-BASED OPTOELECTRONIC DEVICES

(71) Applicants: IMEC VZW, Leuven (BE); Katholieke Universiteit Leuven, KU LEUVEN R&D, Leuven (BE); UNIVERSITEIT HASSELT, Hasselt (BE)

(72) Inventors: Yinghuan Kuang, Genk (BE); Tom Aernouts, Westmeerbeek (BE); Wenya Song, Heverlee (BE); Stijn Lammar, Heverlee (BE)

(73) Assignees: Imec vzw, Leuven (BE); Katholieke Universiteit Leuven, Leuven (BE); Universiteit Hasselt, Hasselt (BE)

( * ) Notice: Subject to any disclaimer, the term of this patent is extended or adjusted under 35 U.S.C. 154(b) by 435 days.

(21) Appl. No.: 18/064,075

(22) Filed: Dec. 9, 2022

(65) Prior Publication Data
US 2023/0197353 A1    Jun. 22, 2023

(30) Foreign Application Priority Data
Dec. 19, 2021   (EP) .................................... 21215793

(51) Int. Cl.
| | |
|---|---|
| *H01G 9/00* | (2006.01) |
| *H01G 9/20* | (2006.01) |
| *H10K 30/30* | (2023.01) |
| *H10K 30/40* | (2023.01) |
| *H10K 71/16* | (2023.01) |

(52) U.S. Cl.
CPC ......... *H01G 9/0036* (2013.01); *H01G 9/2009* (2013.01); *H10K 30/30* (2023.02); *H10K 30/40* (2023.02); *H10K 71/164* (2023.02)

(58) Field of Classification Search
None
See application file for complete search history.

(56) References Cited

FOREIGN PATENT DOCUMENTS

| WO | 2020120991 A1 | 6/2020 |
|---|---|---|
| WO | 2020229826 A1 | 11/2020 |

OTHER PUBLICATIONS

Extended European Search Report dated May 31, 2022 issued in European Patent Application No. 21215793.7.
(Continued)

*Primary Examiner* — Anthony Ho
(74) *Attorney, Agent, or Firm* — McDonnell Boehnen Hulbert & Berghoff LLP

(57) ABSTRACT

A method for forming an intermediate structure in the formation of an optoelectronic device in provided. The method includes: a) obtaining a stack of layers over a substrate holder in a sputtering chamber, the stack of layers comprising an active layer comprising an active material having a perovskite crystal structure, an n-type semiconducting layer comprising a fullerene over the active layer, and an energy alignment layer comprising a lithium halide, a magnesium halide $Al_2O_3$ or a metal fluoride on, and in contact with, the n-type semiconducting layer, wherein the energy alignment layer comprises an exposed top surface, and b) sputtering an n-type semiconducting metal oxide layer on the exposed top surface of the energy alignment layer, wherein said sputtering is performed at a sputtering power density of at most $1\ W \cdot cm^{-2}$ and at a temperature of the stack of layers of at most 100° C.

16 Claims, 8 Drawing Sheets

(56) References Cited

OTHER PUBLICATIONS

Hou et al., "Efficient Tandem Solar Cells with Solution-Processed Perovskite on Textured Crystalline Silicon," Science, 2020, vol. 367, No. 6482, pp. 1135-1140.
Kim et al., "Organic Photovoltaic Solar Cells with Cathode Modified by ZnO," Journal of Nanoscience and Nanotechnology, 2013, vol. 13, pp. 5142-5147.
Li et al., "Perovskite Tandem Solar Cells: From Fundamentals to Commercial Deployment," Chem. Rev., 2020, vol. 120, pp. 9835-9950.
Liu et al., "Triple Cathode Buffer Layers Composed of PCBM, C60, and LiF for High-Performance Planar Perovskite Solar Cells," ACS Appl. Mater. Interfaces, 2015, vol. 7, pp. 6230-6237.
Pisoni et al., "Impact of Interlayer Application on Band Bending for Improved Electron Extraction for Efficient Flexible Perovskite Min-Modules," Nano Energy, 2018, vol. 49, pp. 300-307.
Werner, Jérémie, "Perovskite/Silicon Tandem Solar Cells: Toward Affordable Ultra-High Efficiency Photovoltaics," 2018, pp. 1-173.
Lai, Wei-Chih et al., "Conversion Efficiency Improvement of Inverted $CH_3NH_3PBL_3$ Perovskite Solar Cells with Room Temperature Sputtered ZnO by Adding the C60 Interlayer," Appl. Phys. Lett, 2015, vol. 107, pp. 253301-255301-5.
Sahli, Florent & Werner, Jérémie & Kamino, Brett & Bräuninger, Matthias & Monnard, Raphaël & Paviet-Salomon, Bertrand & Barraud, L. & Ding, Laura & Diaz León, Juan José & Sacchetto, Davide & Cattaneo, Gianluca & Despeisse, Matthieu & Boccard, Mathieu & Nicolay, Sylvain & Jeangros, Quentin & Niesen, Bjoern & Ballif, Christophe. (2018). Fully textured monolithic perovskite/silicon tandem solar cells with 25.2% power conversion efficiency. Nature Materials. 17. 10.1038/s41563-018-0115-4.

METHOD FOR FORMING OF PEROVSKITE-BASED OPTOELECTRONIC DEVICES

CROSS-REFERENCE

This application claims priority from European patent application no. 21215793.7, filed Dec. 19, 2021, which is incorporated by reference in its entirety.

TECHNICAL FIELD

The present disclosure relates to the field of perovskite-based optoelectronic devices. More in particular, the present disclosure relates to methods for forming perovskite-based optoelectronic devices.

BACKGROUND OF THE PRESENT DISCLOSURE

Hybrid organic-inorganic perovskite materials, such as organic-inorganic lead or tin halide based perovskite materials, are promising materials for forming active layers in optoelectronic devices, such as photovoltaics, photodetectors, lasers, and light emitting diodes. However, perovskite materials often suffer from instability when exposed to ambient air, moisture, heat, or oxygen. In addition, the interdiffusion at the interfaces with the adjacent contacting materials may further limit the stability of the perovskite material and hence of the optoelectronic device. One example of such deteriorating diffusion is metal diffusion, for example from metal contacts towards the perovskite active layers. Generally, any solution to such diffusion still results in good electronic transport between the layers, and in a good efficiency of the optoelectronic device.

A metal oxide layer over the perovskite may be used as a barrier for, and thereby prevent ingress of, for example, moisture, oxygen, and metal. Forming of the metal oxide layer is delicate as damage to the perovskite needs to be prevented. For example, sputtering of metal oxides directly on top of the perovskite layer may damage the perovskite layer. At the same time, the metal oxide layer is generally formable at a high rate for commercial exploitation, so that alternative techniques such as Atomic Layer Deposition may not be suitable. In LAI, Wei-Chih, et al., "Conversion efficiency improvement of inverted $CH_3NH_3PbI_3$ perovskite solar cells with room temperature sputtered ZnO by adding the $C_{60}$ interlayer", *Applied Physics Letters*, 2015, Vol. 107, 253301, Lai et al. propose the inclusion of a fullerene layer on the perovskite active layer on which the metal oxide may be sputtered. The fullerene may act as a barrier against sputtering bombardment that would otherwise be directly incident on the perovskite, which may damage the perovskite active layer.

Still, there is a need in the art for further improving charge transport between layers, and increasing the efficiency, of optoelectronic devices comprising a perovskite layer as active layer.

SUMMARY OF THE PRESENT DISCLOSURE

It is an object of the present disclosure to provide a good method for forming at least an intermediate structure in the formation of an optoelectronic device.

The above objective is accomplished by a method according to embodiments of the present disclosure.

It is a benefit of embodiments of the present disclosure that a high throughput for forming the n-type semiconducting metal oxide layer may be achieved, by using sputtering thereof. It is a further benefit of embodiments of the present disclosure that forming of the n-type semiconducting metal oxide layer may not result in damage to layers over which the n-type semiconducting metal oxide layer is sputtered, in particular, the energy alignment layer on which the metal oxide layer is formed. It is, thus, a benefit of embodiments of the present disclosure that, notwithstanding the high throughput, good electrical properties of the resulting optoelectronic device may be achieved. It is still a further benefit of embodiments of the present disclosure that the formation of each layer of the optoelectrical device may, as such, be scalable with industrial, matured deposition techniques, making it appealing for industrialization.

It is a benefit of embodiments of the present disclosure that in a resulting device, manufactured according to embodiments of the present disclosure, the active layer comprises a material having a perovskite crystal structure, that may have a high conversion efficiency between light and electricity. It is a further benefit of embodiments of the present disclosure that in a resulting device, manufactured according to embodiments of the present disclosure, an n-type semiconducting metal oxide layer is present over the active layer that may limit or prevent movement of moisture, air or metals towards the active layer, even at elevated temperatures that may be present in photovoltaics, possibly resulting in a long lifetime of the active layer. It is still a further benefit of embodiments of the present disclosure that in a resulting device, manufactured according to embodiments of the present disclosure, the presence of a thin energy alignment layer may facilitate electronic transport between the active layer and an electric contact.

The present disclosure relates to a method for forming an intermediate structure in the formation of an optoelectronic device. The method comprises a step a) of obtaining a stack of layers over, e.g., on, a substrate holder in a sputtering chamber. The stack of layers comprises: an active layer comprising, e.g., consisting of, an active material having a perovskite crystal structure; an n-type semiconducting layer comprising, e.g., consisting of, a fullerene over, e.g., on, the active layer; and an energy alignment layer comprising, e.g., consisting of, a lithium halide, a magnesium halide, $Al_2O_3$, or a metal fluoride, generally the lithium halide, the magnesium halide, or the metal fluoride, on, and in contact with, the n-type semiconducting layer, wherein the energy alignment layer comprises an exposed top surface. The method further comprises a step b) of sputtering an n-type semiconducting metal oxide layer on the exposed top surface of the energy alignment layer, wherein said sputtering is performed at a sputtering power density of at most 1 $W \cdot cm^{-2}$ and at a temperature of the stack of layers of at most 100° C.

It has been found that the energy alignment layer may provide good energy level alignment between the n-type semiconducting layer comprising the fullerene and the n-type semiconducting metal oxide layer. The energy alignment layer may remove, or prevent from occurring, an electron extraction barrier that otherwise could exist at an interface between the n-type semiconducting layer comprising the fullerene and the n-type semiconducting metal oxide layer. As the energy alignment layer comprises an electron insulating material, the energy alignment layer is generally thin. In embodiments, the energy alignment layer has a thickness ranging from 0.1 nm to 5 nm, generally ranging from 0.5 nm to 2 nm. In embodiments, the energy alignment layer comprises at least at least 60 mass-%, at least 80 mass-%, at least 90 mass-%, at least 95 mass-%, or generally at least 99 mass-%, of the lithium halide, the magnesium halide, $Al_2O_3$, or the metal fluoride, generally of the lithium halide, the magnesium halide, or the metal fluoride. In embodiments, the energy alignment layer comprises lithium fluoride or magnesium fluoride.

It has been found that particularly good electronic properties are obtained for a resulting optoelectronic device if the sputtering is performed when mild sputtering conditions are used, such as a sputtering power density of at most 1 W·cm$^{-2}$ and a temperature of the stack of layers, during the sputtering, of at most 100° C. Without being bound by theory, it is believed that, otherwise, possibly the energy alignment layer, and possibly other underlying layers, may become damaged, resulting in poor electrical properties. In contrast, the low power and low temperature of the sputtering may result in limited or no damage as a result of the sputtering. As a result, the energy alignment layer may remain physically and mechanically intact during the sputtering, so that also the electronic properties of the energy alignment layer may remain good.

At the same time, the sputtering power density is generally not too small, to still achieve good throughput. In embodiments, the sputtering power density ranges from 0.1 W·cm$^{-2}$ to 1 W·cm$^{-2}$, ranges from 0.2 W·cm$^{-2}$ to 0.6 W·cm$^{-2}$, generally ranging from 0.4 W·cm$^{-2}$ to 0.5 W·cm$^{-2}$. Both RF and DC sputtering may be used, depending on the conductivity of the target that is used for the sputtering. Direct current (DC) sputtering may be generally used if the sputter target is sufficiently conductive, e.g., indium tin oxide (ITO). In that case, higher sputter rates may be achieved under a same plasma power density as compared to radiofrequency (RF) sputtering, so that a higher throughput may be achieved. For many n-type metal oxides such as ZnO, $SnO_2$ and $TiO_2$ which are of the highest interest, but which may not be sufficiently conductive to be sputtered with DC sputtering, RF sputtering may be generally used.

Obtaining of the stack of layers is not limited to any technique. The stack of layers may be formed in the sputtering chamber, e.g., by sputtering of each of the layers on the substrate holder of the sputtering chamber. As an alternative example, the stack of layers may be formed outside of the sputtering chamber, using a range of different techniques, and may be transferred into the sputtering chamber, over the substrate holder, so as to obtain the stack of layers over the substrate holder. In embodiments, the active layer may be formed by spin coating, doctor blade coating, slot die coating, spray coating, inkjet printing, dip coating, and thermal evaporation. In embodiments, the n-type semiconducting layer may be formed by thermal evaporation, spin coating, doctor blade coating, slot die coating, spray coating, inkjet printing, and dip coating. In embodiments, the energy alignment layer may be formed by thermal evaporation, e-beam evaporation, sputtering, and atomic layer deposition.

In embodiments, the sputtering may be performed under active cooling of the stack of layers. The active cooling may further limit damage inflicted to the stack of layers, in particular, to the perovskite absorber layer. The active cooling may be implemented by cooling of the substrate holder using means for cooling, such as a cooling liquid. In embodiments, the temperature of the stack of layers ranges from −20° C. to 60° C., generally ranging from −15° C. to 30° C.

In embodiments, the sputtering may be performed at a pressure ranging from 0.1 Pa to 7 Pa, ranging from 0.1 Pa to 2 Pa, or usually ranging from 0.2 Pa to 0.7 Pa. In embodiments, a distance between a target used for said sputtering and a top surface of the stack of layers ranges from 5 cm to 50 cm. It is a benefit of using a high pressure and/or large distance during the sputtering that the material to be deposited loses energy to the gas in the sputtering chamber, so that the bombarding energy released during impact of the material deposited on the top surface of the energy alignment layer may be low, thereby mitigating potential damage that may be inflicted by the sputtering. Typically, the gas in the chamber is a mixed gas of Ar and $O_2$. The gas may range from 0 vol-% to 5 vol-%, usually ranging from 1 vol-% to 3 vol-%, of $O_2$.

In embodiments, the sputtered metal oxide layer has a thickness ranging from 10 nm to 1000 nm, usually ranging from 15 nm to 100 nm. A thick metal oxide layer may be more efficient at preventing moisture, air and metals (originating from, e.g., the top contact) from reaching the active layer. In embodiments, the sputtered metal oxide layer comprises at least at least 80 mass-%, at least 90 mass-%, at least 95 mass-%, or generally at least 99 mass-% of the metal oxide. In embodiments, the sputtered metal oxide layer comprises one of the following: zinc oxide, aluminium-doped zinc oxide, tin dioxide, titanium dioxide, niobium pentoxide, or a transparent, conductive metal oxide comprising indium oxide, such as indium tin oxide, indium zinc oxide, or indium tungsten oxide. In preferred embodiments, the sputtered metal oxide layer comprises one of the following: zinc oxide, tin dioxide, titanium dioxide, or the transparent, conductive metal oxide comprising indium oxide. These n-type semiconducting metal oxides may have good and selective electron conductivity, and may effectively prevent contaminants from reaching the active layer. Furthermore, these materials may be sputtered efficiently without at the same time damaging the stack of layers, in particular the energy alignment layer.

In embodiments, the n-type semiconducting layer comprising the fullerene comprises at least 60 mass-%, at least 80 mass-%, at least 90 mass-%, or generally at least 95 mass-%, of the fullerene. In embodiments, the n-type semiconducting layer comprising the fullerene comprises [6,6]-phenyl-C61-butyric acid methyl ester (PCBM), fullerene-$C_{60}$, [6,6]-phenyl-C71-butyric acid methyl ester (PC71BM), Buckminsterfullerene-$C_{70}$, or bis-PCBM (e.g., comprising a mixture of isomers of bis-PCBM), preferably [6,6]-phenyl-C61-butyric acid methyl ester or fullerene-$C_{60}$. In embodiments, the n-type semiconducting layer comprising the fullerene has a thickness ranging from 5 nm to 200 nm, generally ranging from 10 nm to 50 nm. The n-type semiconducting layer, in particular the fullerene, protects layers of the stack of layers located underneath the n-type semiconducting layer. In particular, the n-type semiconducting layer comprising the fullerene may prevent direct incidence of the sputtering metal oxide on the active layer, which could potentially damage the active layer.

In embodiments, the active layer comprises at least 90 mass-%, at least 95 mass-%, at least 99 mass-%, or generally at least 99.5 mass-%, of the active material having a perovskite crystal structure. In embodiments, the active layer comprises at least one of the following materials: $CH_3NH_3PbI_3$, $CH_3NH_3PbBr_3$, $CH_3NH_3PbCl_3$, $CH_3NH_3PbI_{3-x}Br_x$, $CH_3NH_3PbI_{3-x}Cl_x$, $[CH_3NH_3]_x[HC(NH_2)_2]_{1-x}PbI_3$, $[CH_3NH_3]_x[HC(NH_2)_2]_{1-x}PbBr_3$, $[CH_3NH_3]_x[HC(NH_2)_2]_{1-x}PbCl_3$, $[CH_3NH_3]_x[HC(NH_2)_2]_{1-x}PbI_{3-y}Br_y$, $[CH_3NH_3]_x[HC(NH_2)_2]_{1-x}PbI_{3-y}Cl_y$, $HC(NH_2)_2PbI_3$, $HC(NH_2)_2PbBr_3$, $HC(NH_2)_2PbCl_3$, $HC(NH_2)_2PbI_{3-x}Br_x$, $HC(NH_2)_2PbI_{3-x}Cl_x$, $[HC(NH_2)_2]_{1-x}Cs_xPbI_3$, $[HC(NH_2)_2]_{1-x}Cs_xPbI_{3-y}Br_y$, $CsPbI_3$, $CsPbBr_3$, $CsPbCl_3$, $CsPbI_{3-x}Br_x$, $CsPbI_{3-x}Cl_x$, $CH_3NH_3Pb_{1-x}$ $Sn_xI_{3-y}Br_y$, $(CH_3NH_3)_{1-x-y}[HC(NH_2)_2]_yCs_xPbI_{3-z}Br_z$, $(CH_3NH_3)_{1-x-y}[HC(NH_2)_2]_yCs_xPb_{1-z}Sn_zI_{3-b}Br_b$, or $(CH_3NH_3)_{1-x-y-z}[HC(NH_2)_2]_zCs_yRb_xPbI_{3-\delta}Br_\delta$. The present disclosure is not limited to these examples, and many different perovskite materials may be used. For example, the Pb may, partially or completely, be replaced by Sn. And Pb or Sn of any of the above examples may, partially or completely, be replaced by another group 14 element (wherein group 14 is in accordance with the IUPAC group numbering). Generally, the Pb or Sn may be replaced by Sn or Pb, respectively, or by Ge. In embodiments, a thickness of the active layer may range from 100 nm to 10 μm, generally ranging from 300 nm to 1000 nm.

In embodiments, the method further comprises a step c, after step b, of forming a top contact over, e.g., on, the metal oxide layer, wherein the top contact comprises a metal layer, a metal grid, and/or an optically transparent, electrically conductive metal oxide layer.

In embodiments, the metal layer and/or the metal grid may comprise aluminium, silver, copper, nickel, or gold. In embodiments, a thickness of the metal layer ranges from 10 nm to 1000 nm, ranges from 50 nm to 200 nm, or generally ranging from 80 nm to 150 nm. In embodiments, each wire of the metal layer and grid has a width, parallel to a top surface of the layer underneath the metal grid, ranging from 1 μm to 1000 μm, ranging from 10 μm to 200 μm, or generally ranging from 20 μm to 100 μm. The thickness of the metal grid may range from 100 nm to 200 μm, generally ranging from 500 nm to 50 microns. The metal layer and/or the metal grid may be formed by thermal evaporation, sputtering, and screen printing.

In embodiments, the optically transparent, electrically conductive metal oxide layer comprises, e.g., consists of, a metal oxide mixture comprising indium oxide, such as indium tin oxide, indium zinc oxide, indium tungsten oxide, or hydrogenated indium oxide, or a zinc oxide such as aluminium doped zinc oxide, or boron-doped zinc oxide. In embodiments, the optically transparent, electrically conductive metal oxide layer has a thickness ranging from 50 nm to 500 nm. In embodiments, the optically transparent, electrically conductive metal oxide layer may be formed by sputtering. Features of the sputtering conditions may be independently the same as those described for sputtering of the n-type semiconducting metal oxide layer. It is a benefit of these embodiments that, although a high throughput may be reached due to the sputtering, sputtering damage to the underlying layers, such as to the energy alignment layer, may be further prevented.

In embodiments wherein the top contact comprises the optically transparent, electrically conductive metal oxide layer, the method may further comprise a step c' after step c of forming a further metal grid over, e.g., on, and in electrical contact with, the metal oxide layer. In these embodiments, the top contact comprises the further metal grid. Features of the further metal grid may be independently as described for corresponding features of the metal grid.

The layers, and possibly the top contact, over, e.g., on, the active layer may form an upper contacting stack functioning as a contact for selectively transporting electrons, selectively with respect to holes, from or towards the active layer. In other words, the active layer and the layers over the active layer may be electrically coupled with each other, such that said transport of electrons may be possible between the layers over the active layer, and between the active layer and between the layers over the active layer.

In embodiments, the stack of layers comprises a lower contacting stack, wherein the active layer is located over, e.g., on, the lower contacting stack. In these embodiments, the lower contacting stack comprises a bottom contact layer comprising a metal layer and/or an optically transparent, electrically conductive metal oxide layer, and a p-type semiconducting layer over, e.g., on, the bottom contact layer.

In embodiments, the bottom contact layer comprises, e.g., consists of, one of indium tin oxide, hydrogenated indium oxide, indium zinc oxide, indium tungsten oxide, aluminium doped zinc oxide, or fluorine doped tin oxide. In embodiments, a thickness of the bottom contact layer ranges from 100 nm to 1000 nm. In embodiments, the optically transparent, electrically conductive metal oxide layer may be formed by magnetron sputtering.

In embodiments, the p-type semiconducting layer comprises, e.g., consists of, at least one of nickel oxide, poly [bis(4-phenyl)(2,4,6-trimethylphenyl)amine (PTAA), or poly(3,4-ethylenedioxythiophene):poly (styrenesulfonate) (PEDOT:PSS), [4-(3,6-dimethyl-9H-carbazol-9-yl)butyl] phosphonic acid (Me-4PACz), [2-(9H-carbazol-9-yl)ethyl] phosphonic acid (2PACz), [2-(3,6-dimethoxy-9H-carbazol-9-yl)ethyl]phosphonic acid (MeO-2PACz). In embodiments, a thickness of the p-type semiconducting layer may range from a 0.5 nm to 200 nm, generally ranging from 2 nm to 100 nm. In embodiments, the p-type semiconducting layer may be formed by spin coating.

The lower contacting stack may function as a contact for selectively transporting holes (except, e.g., the substrate, when formed of an insulating material), selectively with respect to electrons from or towards the active layer. In other words, the active layer and layers of the lower contacting stack may be electrically coupled with each other, such that said transport of holes may be possible between the layers of the lower contacting stack, and between the active layer and the layers of the lower contacting stack.

Said selectivity may be due to the p-type semiconducting layer. For example, in embodiments wherein the optoelectronic device is an inverted p-i-n photovoltaic device, light incident on the active layer may generate holes and electrons. The holes may be collected by the lower contacting stack, underneath the active layer. The electrons may be collected by the upper contacting stack, over the active layer. In embodiments wherein the optoelectronic device is a light emitting diode, holes may be transported from the lower contacting stack, and electrons may be transported from the upper contacting stack, towards the active layer, to combine there and emit light.

In embodiments, the lower contacting stack comprises a carrier substrate, wherein the bottom contact layer is located over, e.g., on, the carrier substrate. The carrier substrate may function as mechanical carrier for the layers over the carrier substrate. In embodiments, the carrier substrate has a thickness of at least 15 μm, at least 100 μm, or at least 1 mm. However, the thickness may depend on a composition of the carrier substrate. In embodiments, the carrier substrate is a metal foil, e.g., aluminium foil, and the thickness may be at least 15 μm. In embodiments, the carrier substrate is a polymer sheet (e.g., polyester (PET) sheet), and the thickness may be at least 100 μm. In embodiments, the carrier substrate is formed of flexible glass, and the thickness is at least 100 μm. In embodiments, the carrier substrate is formed of rigid glass, and the thickness it at least 0.5 mm. The carrier substrate may further function as a barrier against moisture and oxygen, so that moisture and oxygen may not reach the active layer from above and from below. In embodiments, the carrier substrate may be electrically conductive, e.g., a metal sheet or a metal foil, made of, for example, aluminium, silver, copper, nickel, or gold. In embodiments, the carrier substrate may be optically transparent. In embodiments, the lower contacting stack comprises an electrically insulating, optically transparent substrate, wherein the bottom contact layer is located over, e.g., on, the optically transparent substrate, and wherein the bottom contact layer is optically transparent. In embodiments, the optically transparent substrate may be formed of a silicate glass or quartz sheet or a transparent polymer.

In embodiments, the stack of layers further comprises a further energy alignment layer comprising a lithium halide, a magnesium fluoride, or a metal fluoride, located between, and contacting, the active layer and the n-type semiconducting layer comprising the fullerene. The further energy alignment layer may improve electrical contact between the active layer and the n-type semiconducting layer, by removing any energy barrier for electron transport that may exist between the active layer and the n-type semiconducting layer in absence of the further energy alignment layer. Features of the further energy alignment layer may be, independently, the same as any of the features described for the energy alignment layer.

In embodiments, the resulting optoelectronic device, produced by a method according to embodiments of the present disclosure, may be any type of device wherein the active layer comprises an active material having a perovskite crystal structural, such as a photovoltaic device, a photodetector, a laser, or a light-emitting diode. In preferred embodiments, the optoelectronic device is a photovoltaic device, preferably an inverted p-i-n photovoltaic device.

In embodiments, optical transparency, e.g., in the context of layers being optically transparent, means having at least 70%, at least 80%, generally at least 90%, transparency to light having a wavelength ranging from 400 nm to 1200 nm. In embodiments, optical transparency means having an average transmission of at least 70%, at least 80%, generally at least 90%, averaged over all wavelengths in a light spectrum ranging from 400 nm to 1200 nm.

Various aspects of the present disclosure are set out in the accompanying independent and dependent claims. Features from the dependent claims may be combined with features of the independent claims and with features of other dependent claims as appropriate and not merely as explicitly set out in the claims.

The above and other characteristics, features and benefits of the present disclosure will become apparent from the following detailed description, taken in conjunction with the accompanying drawings, which illustrate, by way of example, the principles of the present disclosure. This description is given for the sake of example only, without limiting the scope of the present disclosure. The reference figures quoted below refer to the attached drawings.

BRIEF DESCRIPTION OF THE DRAWINGS

FIG. 5A shows a reverse J-V curve for a plurality photovoltaic cells fabricated with the design of PV1.

FIG. 5B shows a reverse J-V curve for a plurality photovoltaic cells fabricated with the design of Ref1, FIG. 5C shows a reverse a J-V curve are shown for a plurality photovoltaic cells fabricated with the design of Ref2.

FIG. 5D shows a reverse J-V curve for a plurality photovoltaic cells fabricated with the design of Ref3.

FIG. 12 is a schematic representation of an optoelectronic device manufactured in accordance with embodiments of the present disclosure. In this example, the optoelectronic device is arranged for at least receiving light through a top surface thereof.

FIG. 13 is a schematic representation of an optoelectronic device manufactured in accordance with embodiments of the present disclosure. This example is the same as that of FIG. 12, except that in this example, there is no optically transparent, electrically conductive metal oxide layer 30, formed on the n-type semiconducting metal oxide layer 2. This example comprises a metal grid 4 on top of the n-type semiconducting metal oxide layer 2.

FIG. 14 is a schematic representation of an optoelectronic device manufactured in accordance with embodiments of the present disclosure. The optoelectronic device of this example is similar as that of Example 2, except that the top contact is not a metal layer, but a further metal grid 4 formed on an optically transparent, electrically conductive metal oxide layer 30.

FIG. 15 is an example similar as that described above in relation to FIG. 12, except that no additional bottom contact layer 12 is present in addition to the carrier substrate 11, that is in this example a metal sheet or foil. In other words, in this example, the carrier substrate 11 is the bottom contact layer 12. Hence, in this example, the carrier substrate 11 acts as bottom contact, i.e., as anode electrode.

FIG. 16 is an example similar as that described above in relation to FIG. 15, except that this example does not comprise the optically transparent, electrically conductive metal oxide layer 30. A metal grid 4 is deposited directly on top of the n-type semiconducting metal oxide layer 2.

FIG. 17 is an example similar as that described above in relation to FIG. 15, except for the further energy alignment layer 17 that is in this example located between the active layer 14 and the n-type semiconducting layer 15.

FIG. 18 is an example similar as that described above in relation to FIG. 16, except for the further energy alignment layer 17 that is in this example located between the active layer 14 and the n-type semiconducting layer 15.

Figure 1:
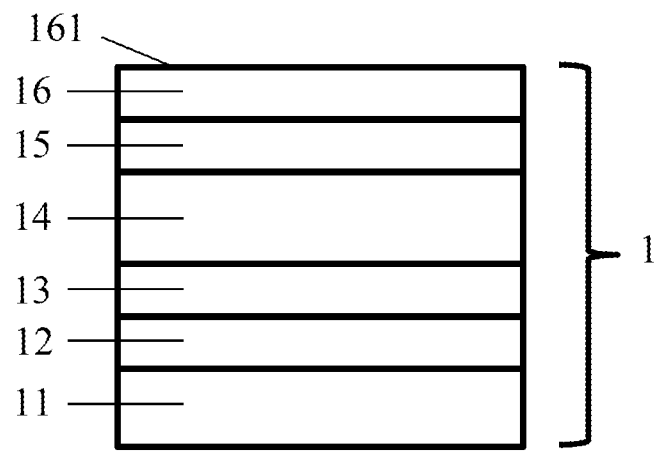
FIG. 1 is a schematic representation of a vertical cross-section of a stack of layers in accordance with embodiments of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the present disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the present disclosure.

Furthermore, the terms first, second, third and the like in the description and in the claims, are used for distinguishing between similar elements and not necessarily for describing a sequence, either temporally, spatially, in ranking or in any other manner. It will be understood that the terms so used are interchangeable under appropriate circumstances and that the embodiments of the present disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the present disclosure described herein are capable of operation in other orientations than described or illustrated herein.

It will be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the present disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Similarly, it is to be noticed that the term "coupled" should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the present disclosure, various features of the present disclosure are sometimes grouped together in a single embodiment, figure, or description thereof for the purpose of streamlining the disclosure and aiding in the understanding of one or more of the various inventive aspects. This method of disclosure, however, shall not to be interpreted as reflecting an intention that the claimed present disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this present disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

The present disclosure will now be described by a detailed description of several embodiments of the present disclosure. It is clear that other embodiments of the disclosure can be configured according to the knowledge of persons of ordinary skill in the art without departing from the technical teaching of the present disclosure, the present disclosure being limited only by the terms of the appended claims.

In the context of the present disclosure, when a first layer is said to be located over a second layer, "over" may be understood to mean that there may be physical contact between the first and second layer, but that is not required. For example, at least one further layer may be present between the first and second layer, but that is not required.

In the context of the present disclosure, when a first layer is said to be located on a second layer, "on" may be understood to mean that there is physical and electrical contact between the first and the second layer, i.e., there is no gap or further layer located between the first and the second layer.

In the contact of the present disclosure, "thickness" may be understood to mean a thickness in a direction from a bottom to a top of the stack of layers, i.e., from a bottom to a top of (the intermediate to) the optoelectronic device. Said thickness may be understood to be measured in a direction perpendicular to, i.e., normal to, a top surface of a layer.

The present disclosure relates to a method for forming an intermediate structure in the formation of an optoelectronic device. The method comprises a step a) of obtaining a stack of layers over a substrate holder in a sputtering chamber. The stack of layers comprises: an active layer comprising an active material having a perovskite crystal structure; an n-type semiconducting layer comprising a fullerene over the active layer; and an energy alignment layer comprising a lithium halide, a magnesium halide, $Al_2O_3$ or a metal fluoride on, and in contact with, the n-type semiconducting layer, wherein the energy alignment layer comprises an exposed top surface. The method further comprises a step b) of sputtering an n-type semiconducting metal oxide layer on the exposed top surface of the energy alignment layer, wherein said sputtering is performed at a sputtering power density of at most 1 W·cm$^{-2}$ and at a temperature of the stack of layers of at most 100° C.

Example 1: Forming of an Optoelectronic Device

Reference is made to FIG. 1, which is a schematic representation of a vertical cross-section of a stack of layers 1 manufactured as part of embodiments of the present disclosure. In this example, the stack of layers 1 comprises a carrier substrate 11, which may function as the mechanical carrier of the optoelectronic device. The carrier substrate 11 may further function as a barrier against moisture and oxygen, and may be optically transparent. The carrier substrate 11 may be electrically insulating or electrically conductive.

In this example, the stack of layers 1 comprises an electrically conductive bottom contact layer 12 on, i.e., in physical contact with, the substrate 11, for collecting holes from active layer 14, or for injecting holes into the active layer 14.

In this example, the stack of layers 1 further comprises a p-type semiconducting layer 13 on, i.e., in physical contact with, the bottom contact layer 12. The p-type semiconducting layer 13 is for selectively transporting holes, and may form a barrier against movements of electrons.

The stack of layers 1 further comprises an active layer 14 comprising an active material having a perovskite crystal structure. In this example, the active layer 14 is located on the p-type semiconducting layer 13. The physical contact between the p-type semiconducting layer 13 and the active layer 14 has the benefit that movement of electrons may be blocked at an interface of the p-type semiconducting 13 layer and the active layer 14. In other words, electrons may not be transported from the active layer 14 through a bottom surface of the active layer 14. Thereby, the electrons remain confined to the active layer 14 and to the layers over the active layer 14, which may, e.g., when considering a photovoltaic device, result in efficient collection of the electrons by a top contact.

The stack of layers 1 further comprises an n-type semiconducting layer 15 comprising a fullerene, that is, in this example, located on the active layer 14. The physical contact between the n-type semiconducting layer 15 and the active layer 14 has the benefit that movement of holes may be blocked at an interface of the n-type semiconducting layer 15 and the active layer 14. In other words, holes may not be transported from the active layer 14 through a top surface of the active layer 14, and thereby remain confined to the active layer 14 and layers beneath the active layer 14, which may, e.g., when considering a photovoltaic device, result in good collection efficiency of the holes by the bottom contact layer 12.

The stack of layers 1 further comprises an energy alignment layer 16 on, and in contact with, the n-type semiconducting layer 15. The energy alignment layer 16 comprises an exposed top surface 161.

Figure 2:
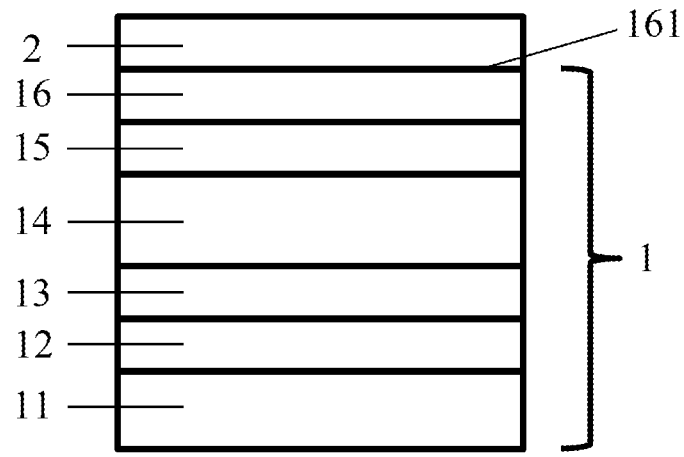
FIG. 2 is a schematic representation of a vertical cross-section of an intermediate structure in the formation of an optoelectronic device in accordance with embodiments of the present disclosure.

Referring to FIG. 2, in a method in accordance with embodiments of the present disclosure, an n-type semiconducting metal oxide layer 2 is sputtered on the exposed top surface 161 of the energy alignment layer 16 of the stack of layers 1. As such, the energy alignment layer 16 is in physical contact with both the n-type semiconducting layer 15 and the n-type semiconducting metal oxide layer 2. When the sputtering is performed under mild conditions, in accordance with embodiments of the present disclosure, physical and electrical properties of the energy alignment layer 16 remain particularly good. Thereby, the energy alignment layer provides good electrical contact, that is, good transport of electrons, between the n-type semiconducting layer 15 and the n-type semiconducting metal oxide layer 2.

Figure 3:
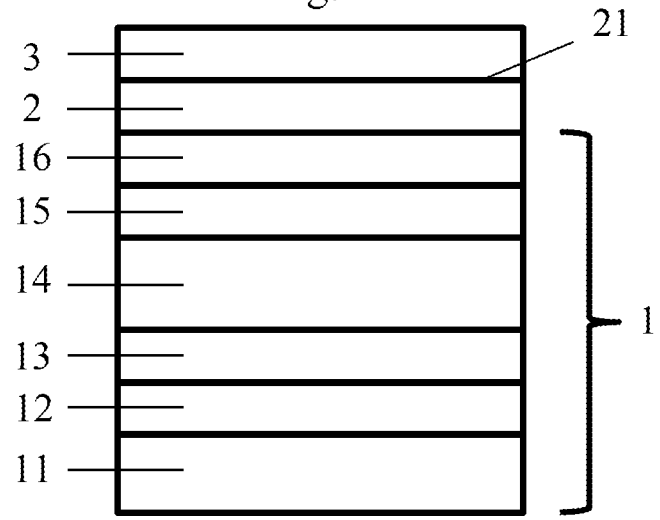
FIG. 3 is a schematic representation of a vertical cross-section of an optoelectronic device manufactured in accordance with a method of embodiments of the present disclosure.

Referring to FIG. 3, a top contact 3 is formed on the n-type semiconducting metal oxide layer 2. In this example, the top contact 3 is a layer, e.g., a metal or metal-oxide layer.

Example 1A: Characteristics of a First Inverted p-i-n Photovoltaic Cell

In a first series of experiments, a first inverted p-i-n photovoltaic cell was formed by using the stack design of Example 1, using a method in accordance with embodiments of the present disclosure.

In this example (and with reference to FIG. 3), the substrate 11 consisted of glass. The bottom contact layer 12 was formed of indium tin oxide, and had a thickness of 120 nm. The bottom contact layer 12 was formed using magnetron sputtering. In this example, the p-type semiconducting layer 13 consisted of poly[bis(4-phenyl)(2,4,6-trimethylphenyl)amine (PTAA), and had a thickness of 5 nm. The p-type semiconducting layer 13 was formed by spin coating. In this example, the active layer 14 consisted of a mixture of 95.23 mol-% $Cs_{0.1}FA_{0.9}PbI_{2.865}Br_{0.135}$ and 4.76 mol-% FACl (wherein FA stands for formamidinium, i.e., $[HC(NH_2)_2]^+$). The active layer 14 was, in this example, spin coated and then annealed at 130° C. for 20 min in a $N_2$ atmosphere. The active layer 14 had a thickness of 500 nm. The n-type semiconducting layer 15 contained fullerene-$C_{60}$ and had a thickness of 40 nm. The n-type semiconducting layer 15 was formed by thermal evaporation at a rate of 1 Å/s. The energy alignment layer 16 consisted of LiF, had a thickness of 0.8 nm, and was formed by thermal evaporation at a rate of 0.1 Å/s. The n-type semiconducting metal oxide layer 2 consisted of ZnO and had a thickness of 15 nm. The n-type semiconducting metal oxide layer 2 was formed by magnetron sputtering under gentle conditions (low plasma power of 0.18 W/cm$^2$, pressure of 3 Torr without extra substrate cooling or heating, namely soft sputtering). In this example, top contact 3 consisted of aluminium (i.e., is a metal layer), and had a thickness of 100 nm. The top contact 3 was formed by thermal evaporation at a rate of 2 Å/s.

As a comparison to the first inverted p-i-n photovoltaic cell, manufactured in accordance with embodiments of the present disclosure, reference photovoltaic cells were formed that are not in accordance with embodiments of the present disclosure. A first reference photovoltaic cell was similar to the first inverted p-i-n photovoltaic cell, except that it did not contain the n-type semiconducting layer 15 nor the energy alignment layer 16. As such, the first reference photovoltaic cell only contained the n-type semiconducting metal oxide layer 2 on the active layer 14 and the top contact 3 on the n-type semiconducting metal oxide layer 2. A second reference photovoltaic cell was similar to the first inverted p-i-n photovoltaic cell, except that it did not contain the energy alignment layer 16. As such, the second reference photovoltaic cell contained the n-type semiconducting layer 15 on the active layer 14, the n-type semiconducting metal oxide layer 2 on n-type semiconducting layer 15, and the top contact 3 on the n-type semiconducting metal oxide layer 2. A third reference photovoltaic cell was similar to the first inverted p-i-n photovoltaic cell, except that it did not contain the n-type semiconducting layer 15. As such, the third reference photovoltaic cell contained the energy alignment layer 16 on the active layer 14, the n-type semiconducting metal oxide layer 2 on the energy alignment layer 16, and the top contact 3 on the n-type semiconducting metal oxide layer 2.

Figure 4:
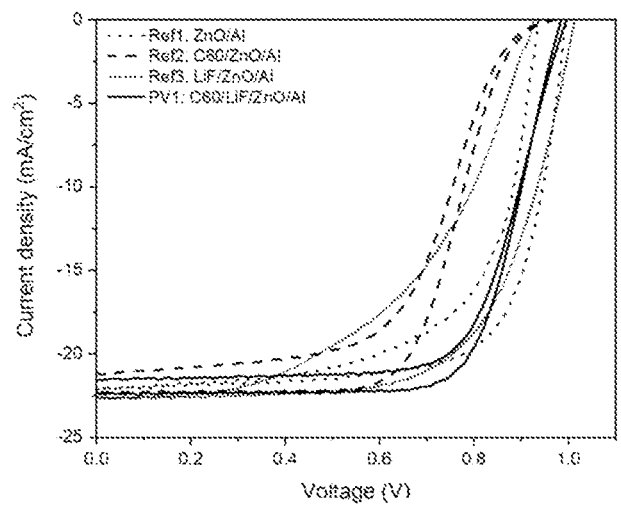
FIG. 4 is a plot of current density-voltage (J-V) scanning curves, with current density plotted as a function of voltage, for a first inverted p-i-n photovoltaic cell formed in accordance with embodiments of the present disclosure, and for three reference photovoltaic cells.
Figure 5A:
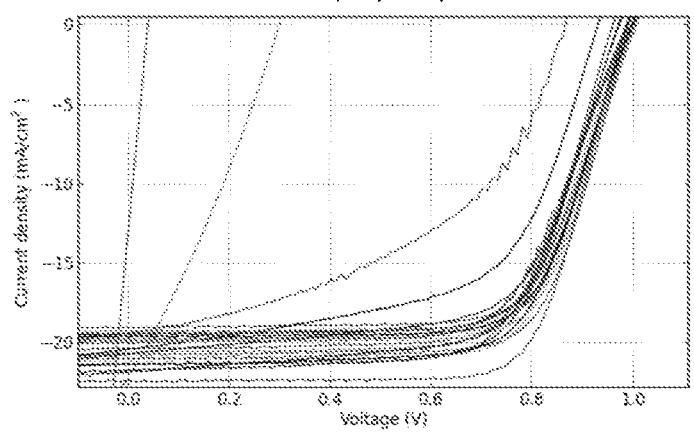
FIGS. 5A, 5B, 5C, and 5D are plots of reverse J-V curves for a range of photovoltaic cells.
Figure 5B:
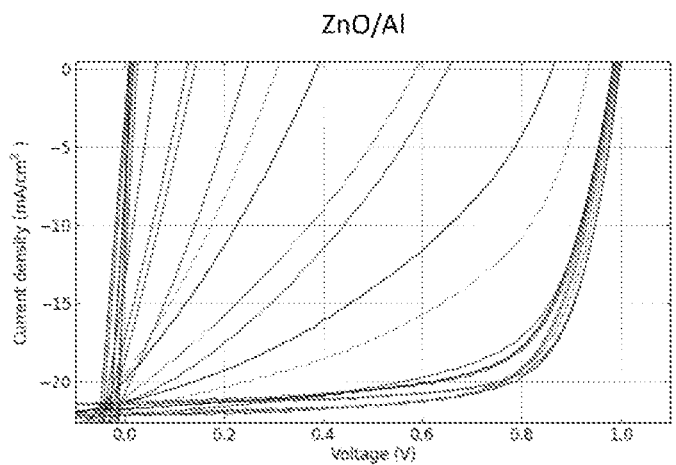
Figure 5C:
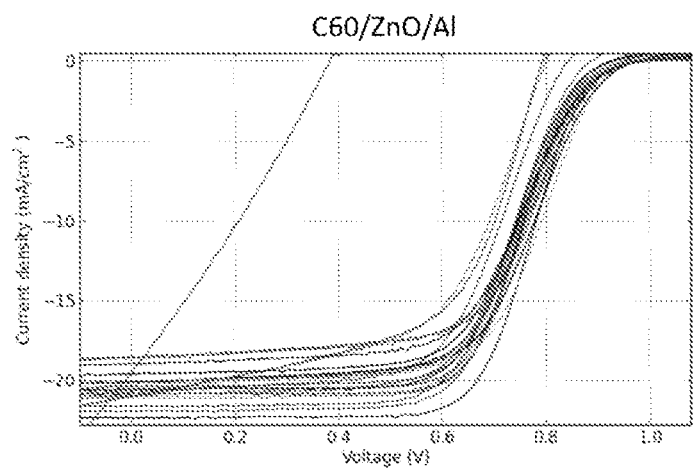
Figure 5D:
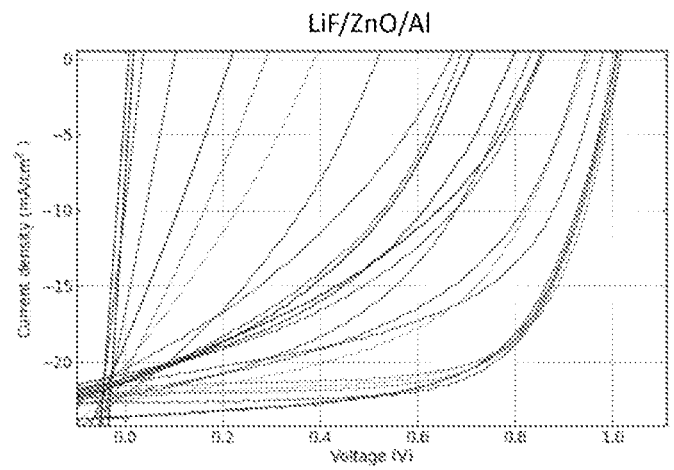

FIG. 4 includes a plot of current density-voltage (J-V) scanning curves, with current density plotted as a function of voltage, for the first inverted p-i-n photovoltaic cell (PV1; full curve), and for the first (Ref1; dotted curves with large spacing between adjacent dots), second (Ref2; dashed curve) and third reference photovoltaic cells (Ref3; dotted curves with small spacing between adjacent dots). For ease of reference to the different curves, a legend is included in FIG. 4. Further reference is made to Table 1, which is an overview of figures of merit for the first inverted p-i-n photovoltaic cell (PV1), and for the first (Ref1), second (Ref2) and third (Ref3) reference photovoltaic cells. Herein, reverse refers to scans from an open circuit voltage ($V_{oc}$) to a short-circuit current density ($J_{sc}$), and forward refers to a scan from $J_{sc}$ to $V_{oc}$. Herein, PCE means the Power Conversion Efficiency, which is the ratio of the incident light power (through a bottom surface of the photovoltaic cell) to the electrical power of the current generated by the photovoltaic cell, i.e.: PCE=$P_{max}/P_{in}$, wherein $P_{max}=V_{oc} \cdot J_{sc} \cdot$FF, wherein FF is the fill factor. For $P_{in}$, a standardized value of 1 kW/m$^2$ is used.

TABLE 1

Experimental figures of merit for the perovskite cells with various photovoltaic cells. The hysteresis index is calculated as ($PCE_{Reverse}$ − $PCE_{Forward}$)/$PCE_{Reverse}$.

| Photovoltaic cell | $J_{sc}$ (mA/cm$^2$) | $V_{oc}$ (V) | FF (%) | PCE (%) | Hysteresis index |
|---|---|---|---|---|---|
| PV1, reverse | 22.3 | 0.99 | 72.65 | 16.06 | 0.068 |
| PV1, forward | 21.5 | 1.00 | 69.43 | 14.96 | |
| Ref1, reverse | 22.1 | 1.00 | 71.35 | 15.77 | 0.158 |
| Ref1, forward | 22.1 | 0.94 | 63.76 | 13.27 | |
| Ref2, reverse | 22.3 | 0.97 | 61.74 | 13.37 | 0.159 |
| Ref2, forward | 21.2 | 0.97 | 54.84 | 11.25 | |
| Ref3, reverse | 22.2 | 1.00 | 66.56 | 14.90 | 0.277 |
| Ref3, forward | 22.2 | 0.94 | 51.73 | 10.78 | |

As can be observed in FIG. 4, the design of the second reference photovoltaic cell Ref2 resulted in an obvious S-shape barrier in the J-V curve. With the insertion of the energy alignment layer, e.g., LiF layer, corresponding to the inverted p-i-n photovoltaic cell (PV1) in accordance with embodiment of the present disclosure, this S-shape barrier disappeared. When the n-type semiconducting metal oxide layer is sputtered directly onto the active layer (corresponding to the first reference photovoltaic cell, Ref1), the photovoltaic cell also worked. However, the hysteresis between forward and reverse scans was considerable (see Table 1). Furthermore, the success rate of generating a working cell was rather low in this case (see below). The third reference Ref3 had an even worse hysteresis (Table 1), and the success rate was only slightly better than that of the second reference (see below).

Referring to FIGS. 5A, 5B, 5C, and 5D, reverse J-V curves are shown for a plurality photovoltaic cells fabricated with the design of PV1, Ref1, Ref2, and Ref3, respectively. With the ZnO deposited by soft sputtering onto perovskite, either with the ultrathin energy alignment layer on the active layer (i.e., Ref3) or without this energy alignment layer (i.e., Ref1), the success rate (that is the ratio of the number of working photovoltaic cells without shunting to the total number of working photovoltaic cells fabricated) was rather low. This is an indication that the sputtering of ZnO on the active layer, in absence of the fullerene-comprising layer, may result in damage to the perovskite layer. In contrast, when 40 nm of fullerene-C$_{60}$ layer was present on top of the active layer before ZnO is sputtered (Ref2), the yield was substantially improved: in the experiments, only a single fabricated photovoltaic cell appeared to be shunted. However, as mentioned above, most of the Ref 2 photovoltaic cells have an S-shape barrier. With the insertion of the energy alignment layer between fullerene-C$_{60}$ and sputtered ZnO (PV1, i.e., in accordance with embodiments of the present disclosure), the barrier in all the devices fabricated was removed, and a good success rate was achieved. Indeed, even though the energy alignment layer is thin (i.e., only 0.8 nm in this example) hence delicate, the mild conditions used for the sputtering did not negatively affect the quality of said energy alignment layer. Thereby, it appeared possible to take full enjoyment of the benefits of the energy alignment layer.

Figure 6:
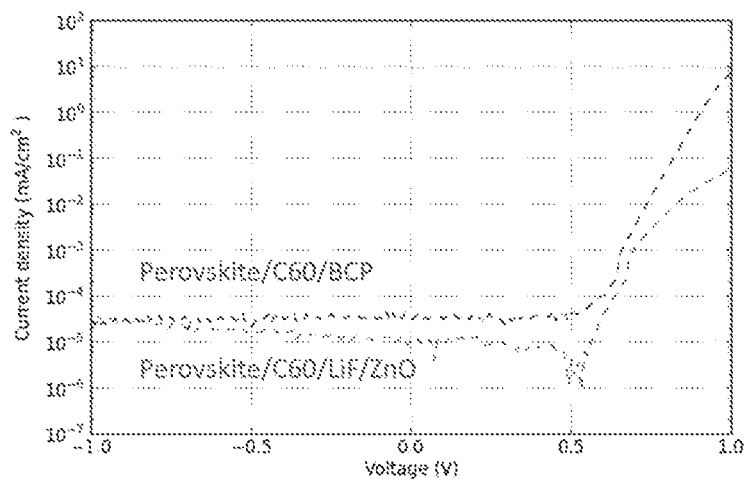
FIG. 6 is a plot of J-V curves for the first inverted p-i-n photovoltaic cell manufactured in accordance with embodiments of the present disclosure, and for a photovoltaic cell manufactured in accordance with the state of the art.

The first inverted p-i-n photovoltaic cell was further compared with a typical inverted p-i-n photovoltaic cell of the state of the art, comprising, on the perovskite layer, a fullerene-C$_{60}$ layer, a bathocuproine layer on the fullerene-C$_{60}$ layer, and a top contact layer on the bathocuproine layer. Reference is made to FIG. 6, which is a plot of a dark J-V curve for the first inverted p-i-n photovoltaic cell and for the typical inverted p-i-n photovoltaic cell of the state of the art. It may be observed that the first inverted p-i-n photovoltaic cell had a reduced dark current compared to the typical inverted p-i-n photovoltaic cell of the state of the. This strongly suggests that the energy alignment layer is not negatively affected by the sputtering process of the present disclosure.

Example 1B: Characteristics of a Second Inverted p-i-n Photovoltaic Cell

In a second series of experiments, a second inverted p-i-n photovoltaic cell was formed in accordance with the stack design of Example 1, using a method in accordance with embodiments of the present disclosure. The second inverted p-i-n photovoltaic cell is formed with the same features as the first inverted p-i-n photovoltaic cell, except that a different active layer and a different top contact are formed. The active layer of the second inverted p-i-n photovoltaic cell contained 76.9 mol-% Cs$_{0.1}$FA$_{0.9}$Pb(I$_{0.9}$Br$_{0.1}$)$_3$ (wherein FA stands for formamidinium, i.e., $[HC(NH_2)_2]^+$) and 23.1 mol-% MACI (where MA stands for methylammonium, i.e., $[CH_3NH_3]^+$). The active layer was also in this example deposited using spin coating, but annealed at 110° C. for 40 min in a $N_2$ atmosphere. The top contact of the second inverted p-i-n photovoltaic cell consisted of silver.

Figure 7:
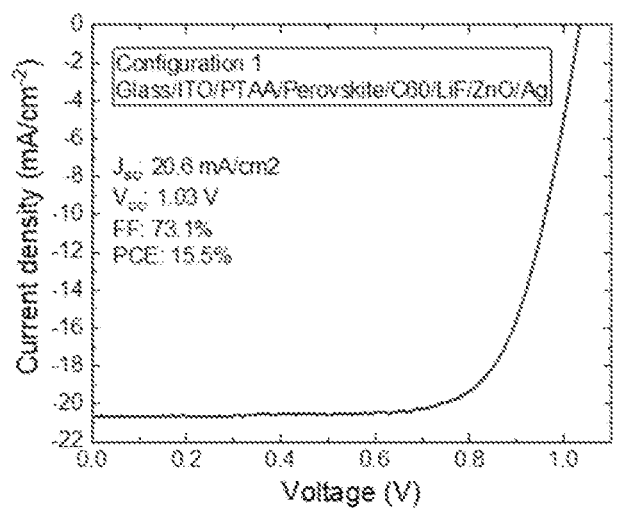
FIG. 7 is a plot of a J-V curve for a second inverted p-i-n photovoltaic cell manufactured in accordance with a method of embodiments of the present disclosure.
Figure 8:
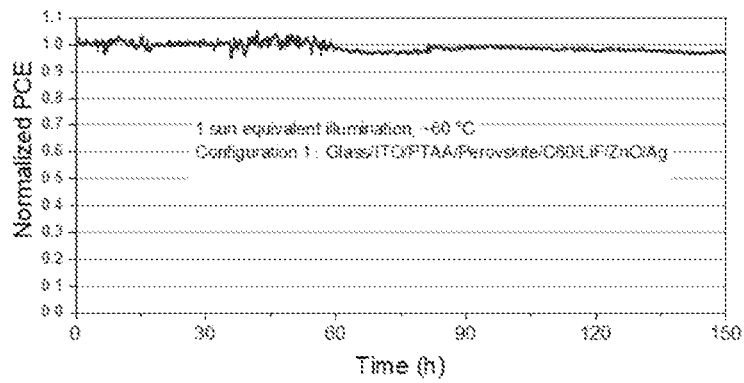
FIG. 8 is a plot of the normalized power conversion efficiency for the second inverted p-i-n photovoltaic cell.

Reference is made to FIG. 7, which shows a plot of a J-V scan for the second inverted p-i-n photovoltaic cell. No S-shaped barrier is observed in the J-V scan. Further reference is made to FIG. 8, which shows a plot of the normalized power conversion efficiency (PCE; normalized with respect to the PCE at t=0 h) at maximum power point under continuous 1-sun equivalent illumination (1000 W/m²) at 60° C. for the second inverted p-i-n photovoltaic cell. It is clear that stability under these conditions is good for the second inverted p-i-n photovoltaic cell. Indeed, the photovoltaic cell, formed in accordance with embodiments of the present disclosure, exhibits excellent operational stability with a 97% to 98% relative PCE after 150 hours of operational stability test (relative to the PCE at t=0 h). These results indicate that the method of the present disclosure also results in a good photovoltaic cell for this alternative composition of the active layer. In particular, this example confirms that the conditions for the sputtering are such that the energy alignment layer is not damaged, so that its positive effect on the electronic and structural properties is still clear. This is also indicated by the limited degradation illustrated in FIG. 8.

Figure 9:
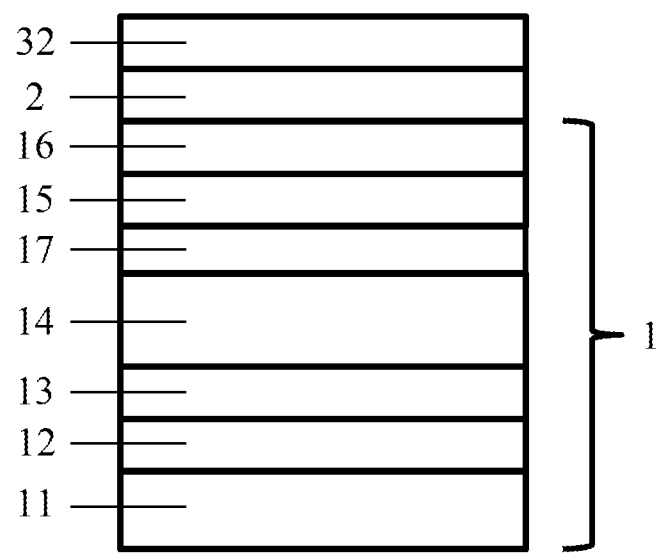
FIG. 9 is a further example of an optoelectronic device formed with a method in accordance with embodiments of the present disclosure.

Example 2: Forming of an Optoelectronic Device Comprising a Further Energy Alignment Layer Reference is made to FIG. 9, which shows an example of an optoelectronic device in accordance with embodiments of the present disclosure, comprising a further energy alignment layer 17. The part of the stack of layers 1 consisting of the carrier substrate 11, the bottom contact layer 12, the p-type semiconducting layer 13, and the active layer 14 has, in this example, identical features and benefits as the corresponding layers of Example 1. In this example, the further energy alignment layer 17 is formed on the active layer 14. The n-type semiconducting layer 15 is formed on the further energy alignment layer 17. The function of the further energy alignment layer 17 is to improve electrical contact between the active layer 14 and the n-type semiconducting layer 15. The n-type semiconducting layer 15, the energy alignment layer 16, the n-type semiconducting metal oxide layer 2, and the top contact, i.e., metal layer 32, have the same features and benefits as the corresponding layers of Example 1.

In a further experiment, a third inverted p-i-n photovoltaic cell was formed, in the same way as the second inverted p-i-n photovoltaic cell, except that the further energy alignment layer 17 was included as indicated above. In this example, the further energy alignment layer 17 consisted of LiF, had a thickness of 0.8 nm, and was formed by thermal evaporation at a rate of 0.1 Å/s.

Figure 10:
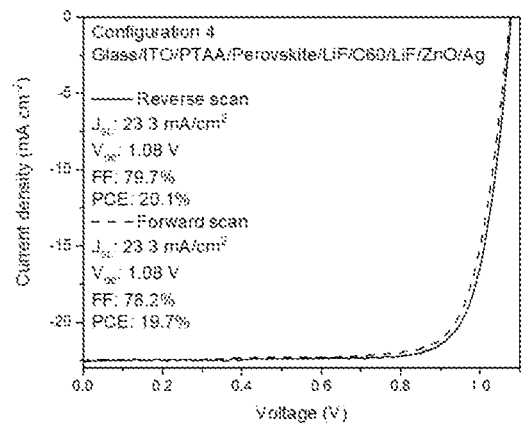
FIG. 10 is a plot of a J-V curve for a third inverted p-i-n photovoltaic cell manufactured in accordance with embodiments of the present disclosure, in forward and reverse scan mode.
Figure 11:
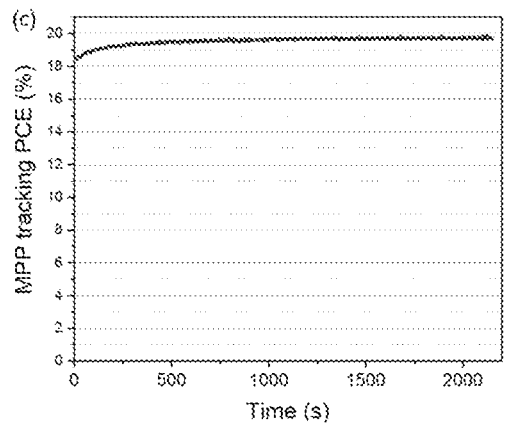
FIG. 11 is a plot of the power conversion efficiency for the third inverted p-i-n photovoltaic cell, at maximum power point condition as a function of time.

Reference is made to FIG. 10, which shows a plot of a J-V curve for the third inverted p-i-n photovoltaic cell in forward and reverse scan mode. For this structure, an excellent 20.1% PCE was observed, with only a slightly lower PCE of 19.7% from the forward scan, corresponding to a negligible hysteresis index of 0.02. Further reference is made to FIG. 11, which shows a plot of the PCE at maximum power point condition as a function of time, under 1-sun equivalent illumination (corresponding to 1000 W/m²) and 30° C. and in a $N_2$ atmosphere, indicating good stability for the third inverted p-i-n photovoltaic cell. Comparison with the first inverted p-i-n photovoltaic cell (PV1 in Table 1) shows an improved PCE and hysteresis index for the third inverted p-i-n photovoltaic cell, indicating the positive effect of the further energy alignment layer.

Example 3: Further Optoelectronic Devices

In this section, a range of optoelectronic devices that may be formed in accordance with embodiments of the present disclosure are shown, to provide further examples within the scope of the present disclosure.

Figure 12:
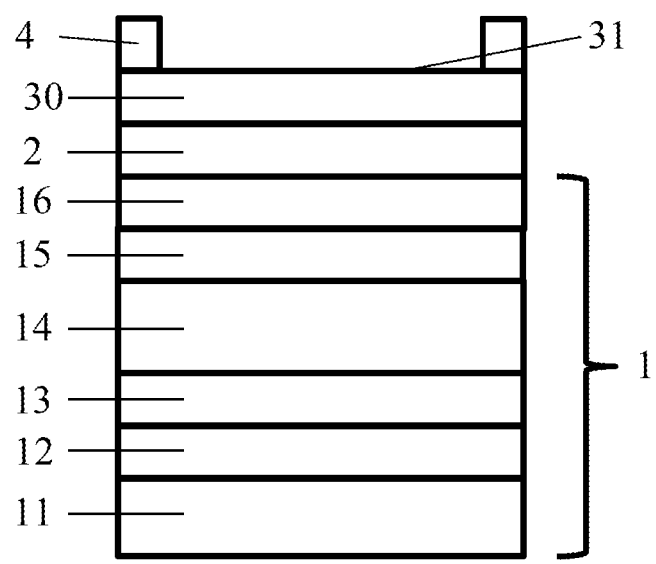
FIG. 12 through 18 are different examples of optoelectronic devices formed with a method in accordance with embodiments of the present disclosure.

Reference is made to FIG. 12, which is a schematic representation of an optoelectronic device manufactured in accordance with embodiments of the present disclosure. In this example, the optoelectronic device is arranged for at least receiving light through a top surface thereof. In this example, the substrate 11 may be glass sheet or transparent plastic based substrate for semi-transparent devices. Alternatively, the substrate 11 may be a non-transparent substrate, such as a metal foil. Layers 12 to 16 and the n-type semiconducting metal oxide layer 2, that is preferably optically transparent, may be the same, and formed in the same way, as the corresponding layers of Example 1. However, in this example, the top contact that is formed is different.

In this example, the top contact comprises an optically transparent, electrically conductive metal oxide layer 30, formed on the n-type semiconducting metal oxide layer 2. The conductive metal oxide layer 30 may act as a lateral charge collecting electrode. Furthermore, in this example, the top contact comprises a further metal grid 4, formed on the conductive metal oxide layer 30. To reduce the optical shadow cast by the further metal grid 4, the further metal grid 4 generally has a small width. In this example, a top surface 31 of the optically transparent, electrically conductive metal oxide layer 30 comprises a first region covered by the further metal grid 4, and a second region not covered by the further metal grid 4, e.g., exposed to air or covered by a non-conducting, optically transparent polymer material. Generally, a ratio of an area of the second region to an area of the first region is as large as possible, e.g., at least 10.

Figure 13:
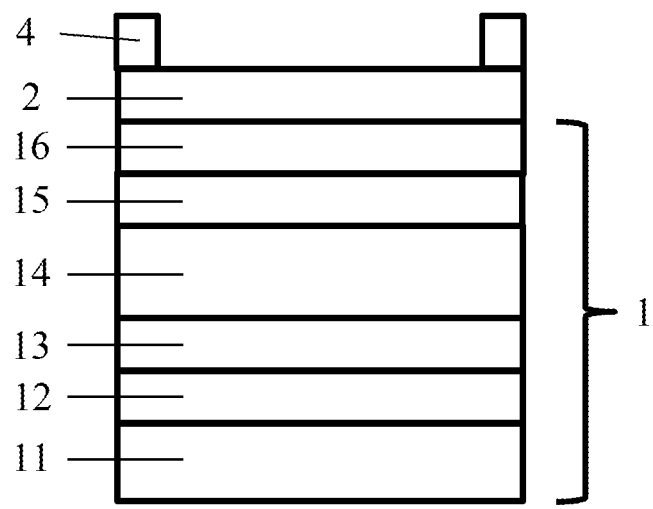

Reference is made to FIG. 13, which is a schematic representation of an optoelectronic device manufactured in accordance with embodiments of the present disclosure. This example is the same as that of FIG. 12, except that in this example, there is no optically transparent, electrically conductive metal oxide layer 30, formed on the n-type semiconducting metal oxide layer 2. This example comprises a metal grid 4 on top of the n-type semiconducting metal oxide layer 2. The n-type semiconducting metal oxide layer 2 is, in this example, optically transparent and electrically conductive, serving both as electron transport layer and as top transparent conductive oxide. For example, indium tin oxide may be a suitable material for the n-type semiconducting metal oxide layer 2.

Figure 14:
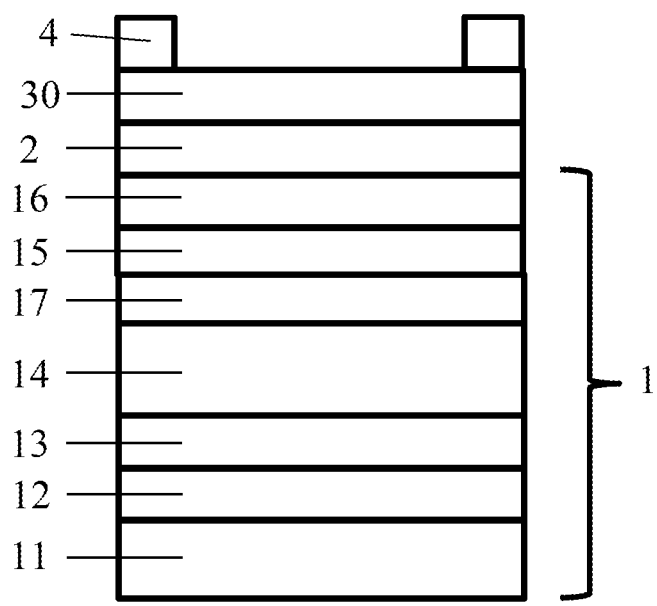

Reference is made to FIG. 14, which is a schematic representation of an optoelectronic device manufactured in accordance with embodiments of the present disclosure. The optoelectronic device of this example is similar as that of Example 2, except that the top contact is not a metal layer, but a further metal grid 4 formed on an optically transparent, electrically conductive metal oxide layer 30. This configuration may facilitate light transmission through the layers above the active layer 14.

Figure 15:
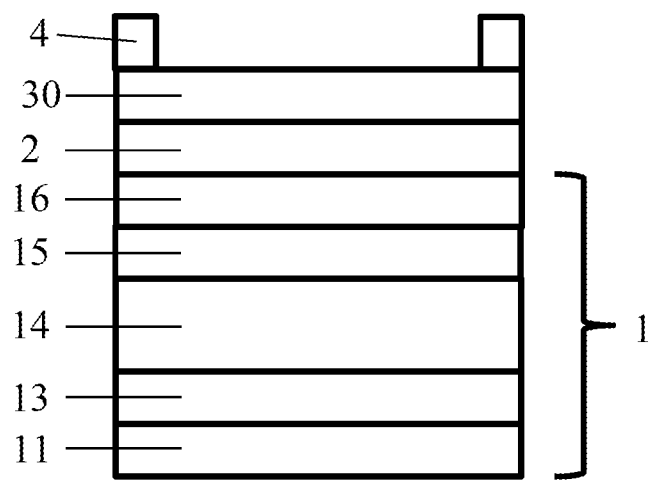

Reference is made to FIG. 15, which is an example similar to that described above in relation to FIG. 12, except that no additional bottom contact layer 12 is present in addition to the carrier substrate 11, that is in this example a metal sheet or foil. In other words, in this example, the carrier substrate 11 is the bottom contact layer 12. Hence, in this example, the carrier substrate 11 acts as bottom contact, i.e., as anode electrode. Potential metal diffusion from the carrier substrate may be prevented by the p-type semiconducting layer 13.

Figure 16:
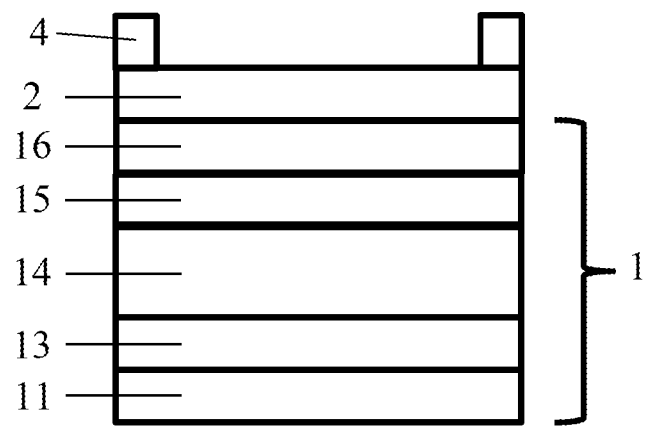

Reference is made to FIG. 16, which is an example similar to that described above in relation to FIG. 15, except that this example does not comprise the optically transparent, electrically conductive metal oxide layer 30. A metal grid 4 is deposited directly on top of the n-type semiconducting metal oxide layer 2.

Figure 17:
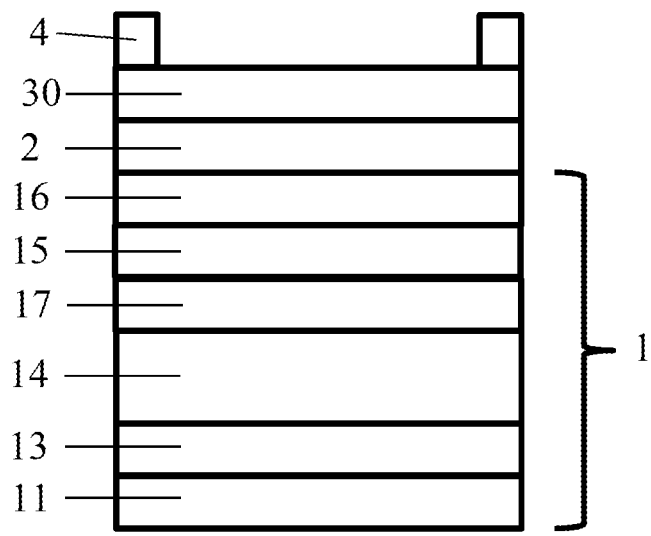

Reference is made to FIG. 17, which is an example is similar to that described above in relation to FIG. 15, except for the further energy alignment layer 17 that is in this example located between the active layer 14 and the n-type semiconducting layer 15.

Figure 18:
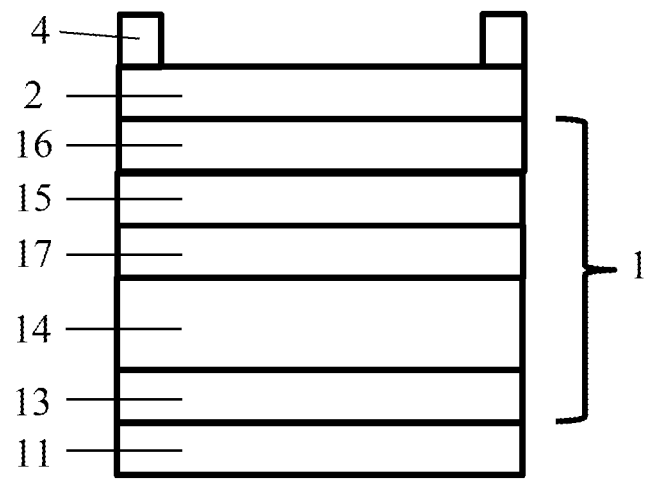

Reference is made to FIG. 18, which is an example similar to that described above in relation to FIG. 16, except for the further energy alignment layer 17 that is in this example located between the active layer 14 and the n-type semiconducting layer 15.

It will be understood that although various embodiments, specific constructions and configurations, as well as materials, have been discussed herein for manufacturing devices according to embodiments of the present disclosure, various changes or modifications in form and detail may be made without departing from the scope of this present disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for forming an intermediate structure in the formation of an optoelectronic device, wherein the method comprises:
   a) obtaining a stack of layers over a substrate holder in a sputtering chamber, the stack of layers comprising:
      an active layer comprising an active material having a perovskite crystal structure,
      an n-type semiconducting layer comprising a fullerene over the active layer, and
      an energy alignment layer comprising a lithium halide, a magnesium halide, $Al_2O_3$ or a metal fluoride on, and in contact with, the n-type semiconducting layer, wherein the energy alignment layer comprises an exposed top surface; and
   b) sputtering an n-type semiconducting metal oxide layer on the exposed top surface of the energy alignment layer, wherein said sputtering is performed at a sputtering power density of at most 1 $W \cdot cm^{-2}$ and at a temperature of the stack of layers of at most 100° C.

2. The method according to claim 1, further comprising a step c, after step b, of forming a top contact over the n-type semiconducting metal oxide layer, wherein the top contact comprises a metal layer, a metal grid, and/or an optically transparent, electrically conductive metal oxide layer.

3. The method according to claim 1, wherein the sputtering is performed under active cooling of the stack of layers.

4. The method according to claim 2, wherein the sputtering is performed under active cooling of the stack of layers.

5. The method according to claim 1, wherein the sputtering is performed at a pressure ranging from 0.1 Pa to 7 Pa.

6. The method according to claim 5, wherein the sputtering is performed at a pressure ranging from 0.2 Pa to 0.7 Pa.

7. The method according to claim 1, wherein sputtering is performed with a distance between a target used for said sputtering and a top surface of the stack of layers ranging from 5 cm to 50 cm.

8. The method according to claim 1, wherein obtaining the stack of layers comprises obtaining the stack of layers wherein the energy alignment layer has a thickness ranging from 0.5 nm to 2 nm.

9. The method according to claim 1, wherein obtaining the stack of layers comprises obtaining a lower contacting stack, wherein the active layer is located over the lower contacting stack, wherein the lower contacting stack comprises:
   a bottom contact layer comprising a metal layer and/or an optically transparent, electrically conductive metal oxide layer, and
   a p-type semiconducting layer over the bottom contact layer.

10. The method according to claim 9, wherein the lower contacting stack further comprises an electrically insulating, optically transparent substrate, wherein the bottom contact layer is located over the optically transparent substrate, and wherein the bottom contact layer is optically transparent.

11. The method according to claim 1, wherein obtaining the stack of layers further comprises obtaining a further energy alignment layer comprising a lithium halide, a magnesium fluoride or a metal fluoride, located between, and contacting, the active layer and the n-type semiconducting layer.

12. The method according to claim 1, wherein the sputtered metal oxide layer has a thickness ranging from 10 nm to 1000 nm.

13. The method according to claim 1, wherein the sputtered metal oxide layer comprises one of the following: zinc oxide, tin oxide, titanium oxide, or a transparent, conductive metal oxide comprising indium oxide.

14. The method according to claim 1, wherein the energy alignment layer comprises lithium fluoride or magnesium fluoride.

15. The method according to claim 1, wherein the n-type semiconducting layer comprises [6,6]-phenyl-C61-butyric acid methyl ester or fullerene-Co.

16. The method according to claim 1, wherein the n-type semiconducting layer has a thickness ranging from 10 nm to 50 nm.

* * * * *